United States Patent [19]
Miles et al.

[11] Patent Number: 6,069,040
[45] Date of Patent: May 30, 2000

[54] FABRICATING A FLOATING GATE WITH FIELD ENHANCEMENT FEATURE SELF-ALIGNED TO A GROOVE

[75] Inventors: Glen L. Miles, Essex Junction; Robert K. Leidy, Burlington, both of Vt.

[73] Assignee: International Business Machines Corporation, Armonk, N.Y.

[21] Appl. No.: 09/084,702

[22] Filed: May 26, 1998

[51] Int. Cl.[7] ................................................. H01L 21/8247

[52] U.S. Cl. .......................................... 438/260; 438/593

[58] Field of Search ................................... 438/257–267, 438/593–594

[56] References Cited

U.S. PATENT DOCUMENTS

| | | | |
|---|---|---|---|
| 5,767,005 | 6/1998 | Doan et al. | 438/593 |
| 5,854,501 | 12/1998 | Kao | 257/316 |
| 5,907,775 | 5/1999 | Tseng | 438/261 |
| 6,008,112 | 12/1999 | Acocella et al. | 438/593 |

*Primary Examiner*—Richard Booth
*Attorney, Agent, or Firm*—Pollock, Vande Sande & Amernick; Eugene I. Shkurko

[57] ABSTRACT

Floating gates with field enhancement features are produced by a technique that makes possible structures smaller than the lithographically defined image. The floating gates produced having sharp tips for source-side injection flash memory cells. Moreover, the process provides an insulator cap over the floating gate that is self-aligned.

16 Claims, 10 Drawing Sheets

FABRICATING A FLOATING GATE WITH FIELD ENHANCEMENT FEATURE SELF-ALIGNED TO A GROOVE

DESCRIPTION

1. Technical Field

The present invention is concerned with a process for providing a field enhancement floating gate. In particular, the present invention is concerned with fabricating a floating gate having sharp tips especially for a source-side injection flash memory cell. More particularly, the process of the present invention provides floating gates having sharp points along with an insulation cap that is self-aligned to a pre-existing topography. The present invention makes it possible to create sublithographic devices along with a floating gate having enhanced or sharper edges. In addition, the present invention is concerned with devices obtained by the above process.

2. Background of Invention

Field effect transistors (FETs) employing a so-called "floating gate" along with a control gate are well known. The floating gate differs from a control gate in that it has no direct electrical connection to any external component and is surrounded by isolation on all sides. The presence of the control gate enables the device to function as a regular FET, while the floating gate collects and stores injected electrons or holes. The floating gate provides a method for changing the threshold voltage needed to pass a charge from the source to the drain. The presence of the control gate adds control to the injection of charges into and out of the floating gate, and thus enables the device to function as an electrically reprogrammable memory device.

Source-side injection flash cells are commonly used as embedded flash memories. One relatively popular flash cell employs oxidized polysilicon to create sharp points in the polysilicon in order to enhance the electric field. This in turn allows erasure at lower voltages and provides for thicker dielectric layers between the floating gate and the control gate. The commonly used process for fabricating such cells is referred to as localized oxidation of silicon (LOCOS) process over the floating gate polysilicon to form an insulator cap along with sharp points on the floating gate. The LOCOS process results in birds beak creating the sharp points, but also results in a floating gate having dimensions larger than the lithographic image. Accordingly, it would seem desirable to provide a process for fabricating pointy floating gate structures whereby the floating gate is smaller than the lithographically defined image.

SUMMARY OF INVENTION

An objective of the present invention is to provide a fabrication technique for producing pointy floating gate structures that are also smaller than the lithographically defined image, thereby permitting use of older photolithographic technology or smaller cells. The process of the present invention provides floating gates having sharp tips for a source-side injection flash memory cell. The process of the present invention forms an insulator cap over the floating gate that is self-aligned.

More particularly, the present invention is concerned with a process for providing a substantially biplanar substrate structure having a first insulating layer on a first plane of the substrate adjacent to a second insulating material on a second plane of the substrate, wherein the first plane is above the second plane. The process comprises forming an opening in the first insulating layer overlapping the second insulating layer down to at least the first plane of the substrate including exposing a first plane substrate area; and forming a thin insulating layer on the first plane substrate area. Next, a first conductive layer is formed on the structure wherein this first conductive layer has first indentations over the thin insulating layer. A fourth insulating layer is next formed on the first conductive layer. The fourth insulating layer is planarized down to the first conductive layer including leaving portions of the fourth insulating layer remaining in the first indentations. Regions of the first conductive layer not located beneath the portions of the fourth insulating layer are removed. A device insulating layer is formed and then a second conductive layer is formed over at least a portion of the first conductive layer.

Another aspect of the present invention relates to an alternative process for providing a substantially biplanar substrate structure having a first insulating material on a first plane of the substrate adjacent to a second insulating material on a second plane of the substrate, wherein the first plane is above the second plane. This process sequence comprises forming an opening in the first insulating material overlapping the second insulating material down to at least the first plane of the substrate, including exposing a first plane substrate area. A thin insulating layer is formed on the first plane substrate area and a first conductive layer is formed on the structure wherein the first conductive layer has first indentations over the thin insulating layer. The process further comprises forming a fourth insulating layer on the first conductive layer. The fourth insulating layer has second indentations located above the first indentations. Next, a patterning material is formed in the second indentations and portions of the fourth insulating layer not located beneath the patterning material is removed. The fourth insulating layer is planarized down to the first conductive layer including leaving portions of the fourth insulating layer in the first indentations. Regions of the first conductive layer not located beneath the portions of the fourth insulating layer are removed. A device insulating layer is next formed followed by forming a second conductive layer over at least a portion of the first conductive layer.

According to a further aspect of the present invention, a structure is fabricated by providing a substrate and forming on the substrate a first insulating layer. Next, preselected portions of the first insulating layer are removed including some of the substrate beneath removed portions of the first insulating layer. A second insulating layer is formed on the substrate and on at least some of the remaining portions of the first insulating layer. A first patterning layer is formed on the second insulating layer. An opening above and wider than at least one of the remaining portions of the first insulating layer is formed through the first patterning layer down to the second insulating layer. A second patterning material is deposited on the first patterning layer and in the opening. Then, the top surface of the structure is planarized until a portion of the second insulating layer is exposed. The exposed portion of the second insulating layer is partially removed. In addition, at least some of any remaining portions of the first patterning layer and the second patterning material is removed. The structure is then planarized down to at least the first insulating layer, including forming adjacent regions of the first insulating layer and the second insulating layer. An opening is formed in the first insulating layer and an adjacent area of the second insulating layer. The opening has a depth equal to or greater than a depth of the first insulating layer but less than a depth of the second insulating layer, thereby exposing a substrate area beneath the first insulating layer. A thin insulating layer is then formed on the substrate area. A first conductive layer is formed on the structure wherein the first conductive layer has first indentations and is formed over the thin insulating layer. A fourth insulating layer is formed on the first conductive layer. The fourth insulating layer is planarized down to the first conductive layer including leaving portions of the fourth insulating layer remaining in the first indentations. Regions of the conductive layer not located beneath the portions of the fourth insulating layer are removed. Next, a device insulating layer is formed followed by forming a second conductive layer over at least a portion of the first conductive layer.

A still further aspect of the present invention is concerned with fabricating a structure comprising providing a substrate and forming a first insulating layer on the substrate. Predetermined portions of the first insulating layer are removed as well as some of the substrate beneath removed portions of the first insulating layer being removed. A second insulating layer is formed on the substrate and on at least some of the remaining portions of the first insulating layer. A first patterning layer is formed on the second insulating layer and an opening through the first patterning layer down to the second insulating layer is formed. The opening is above and wider than at least one of the remaining portions of the first insulating layer. A second patterning material is disposed on the first patterning layer and in the opening. The top surface of the structure is planarized until a portion of the second insulating layer is exposed. The exposed portion of the second insulating layer is then partially removed. At least some of any remaining portions of the first patterning layer and the second patterning material is removed. The structure is then planarized down to at least the first insulating layer including forming adjacent regions of the first insulating layer and the second insulating layer. An opening is formed overlapping the first insulating layer and an adjacent region of the second insulating layer. The opening has a depth equal to or greater than a depth of the first insulating layer but less than a depth of the second insulating layer. The opening exposes a substrate area beneath the first insulating layer. A thin insulating layer is formed on the substrate area. A first conductive layer is formed on the structure wherein the first conductive layer has first indentations and is formed over the thin insulating layer. A fourth insulating layer is formed on the first conductive layer. The fourth insulating layer has second indentations over the first indentations. A patterning material is formed in the second indentations and portions of the fourth insulating layer not beneath the patterning material is removed. The structure is planarized down to the first conductive layer including leaving portions of the fourth insulating layer in the first indentations. Regions of the first conductive layer not located beneath the portions of the fourth insulating layer are removed. A device insulating layer is formed followed by a second conductive layer over at least a portion of the first conductive layer.

Furthermore, the present invention is concerned with structures obtained by the above described processes.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
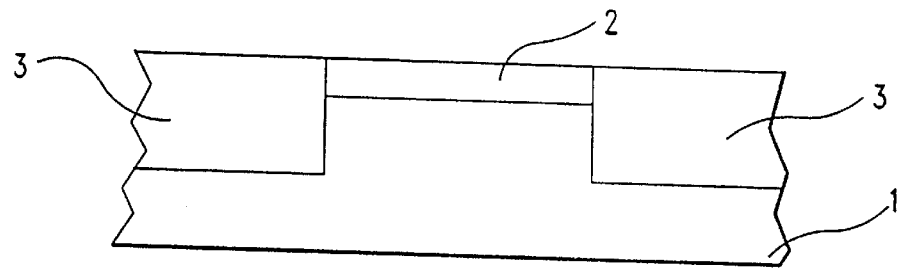
FIGS. 1–7 are schematic diagrams of the structure in various stages of the processing according to an embodiment of the present invention.

In order to facilitate an understanding of the present invention, reference will be made to the figures which illustrate diagrammatic representations of the steps of various embodiments of the present invention. According to one aspect of the present invention, a first insulating layer 2 is formed on a semiconductor substrate 1. The semiconductor substrate 1 is typically silicon but can be any other semiconductor material such as group III–IV semiconductor. The insulating layer 2 can be grown on the substrate or can be provided by deposition techniques such as chemical vapor deposition (CVD). Insulating layer 2 is typically silicon nitride and conventionally referred to as the pad nitride. Typically, this layer is about 200 to about 5000 Å thick and more typically about 1000 to about 2500 Å thick. Predetermined portions of the first insulating layer 2 are removed as well as removing some of the substrate 1 located beneath the removed portions of this first insulating layer. The insulating layer portions can be removed by reactive ion etching.

A second insulating layer 3 is formed on the substrate 1 and on at least some of the remaining portions of the first insulating layer 2. This insulating layer 3 can be provided by deposition techniques such as chemical vapor deposition (CVD) or physical vapor deposition (PVD).

More particularly, the second insulating layer 3 is CVD silicon dioxide or an oxide obtained from tetraethylorthosilicate (TEOS). This layer is typically about 1000 to about 10,000 Å thick and more typically about 3000 to about 5000 Å thick and is referred to as shallow trench isolation (STI).

An opening 4 is formed in the first insulating layer 2 and overlaps the second insulating layer 3 down to at least the first plane 1 of the substrate including exposing a first plane substrate area. The opening as shown resembles a "bathtub" which extends into the coplanar shallow trench isolation 3. The opening is created by etching through the layers 2 and 3. A non-selective etch can be used initially, but then can be switched to a selective nitride to oxide etch during the over-etch portion of the sequence to avoid trenching the shallow trench insulation at the edge of the substrate 1. Typical etchants used for this step are $CHF_3/O_2$. The insulating layer 3 is adjacent the insulating layer 2 with the top surfaces of both being coplanar and with the bottom surface of layer 3 being at a plane lower than the plane of the bottom surface of layer 2.

Figure 2:
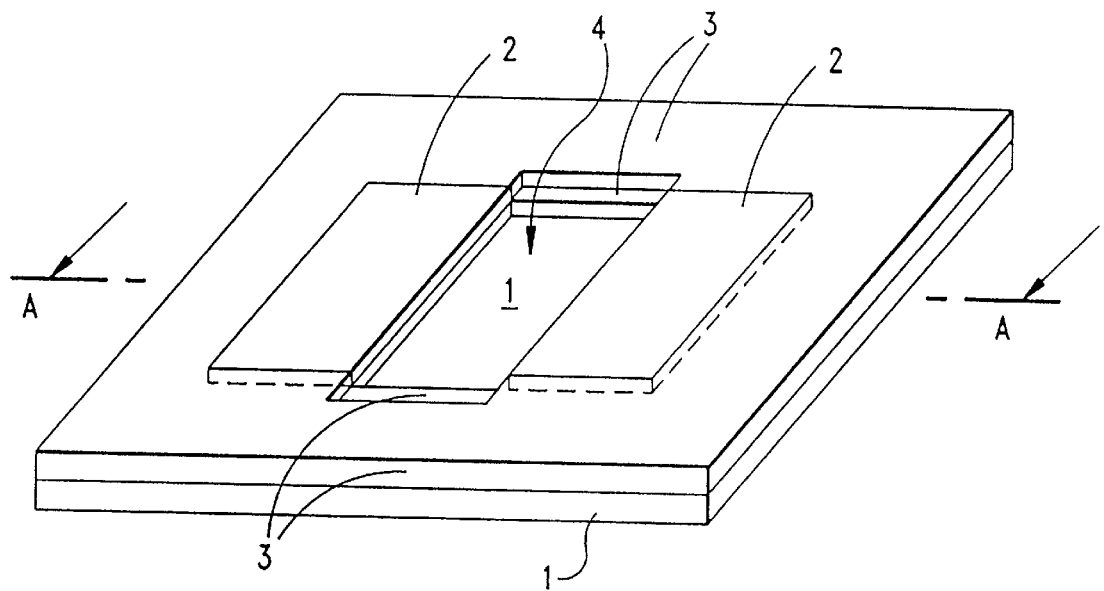
Figure 3:
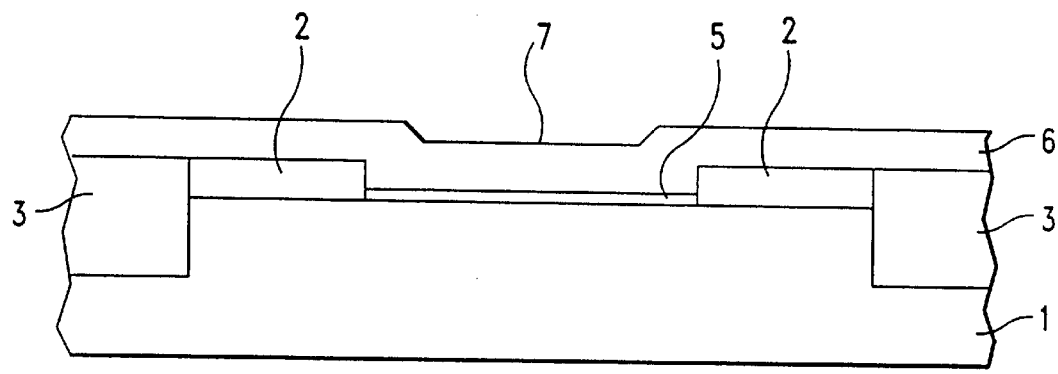
Figure 4:
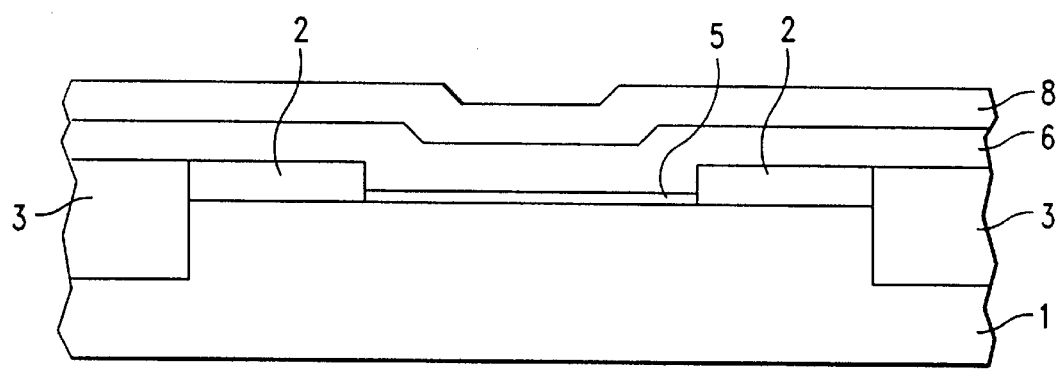
Figure 5:
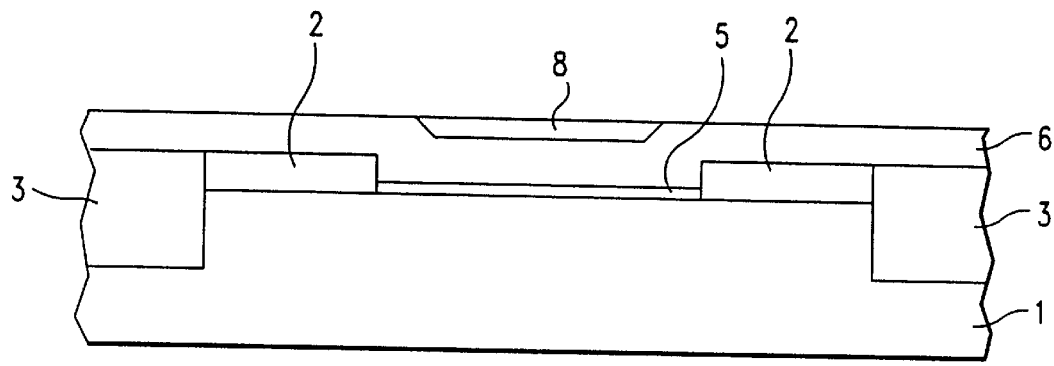

A thin insulating layer 5 is formed on the substrate area such as by thermal oxidation of the underlying substrate (see FIG. 3). This layer is typically about 30 to about 300 Å thick, and more typically about 60 to about 100 Å thick. A first conductive layer 6 is formed (see FIG. 3). FIGS. 3–7 are schematic cross-sectional views cut in the direction A—A shown in FIG. 2. The first conductive layer 6 has first indentations 7. A preferred conductive material is polycrystalline silicon.

A further insulating layer 8 is formed over the conductive layer such as by oxidizing a portion of the polysilicon or by depositing an insulating layer such as by a CVD TEOS (tetraethylorthosilicate) deposition depending on the "tub" depth and thickness of the polysilicon. (See FIG. 4). Typically, the polysilicon layer is about 300 to about 5000 Å thick, and more typically about 600 to about 2000 Å thick. The insulating layer 8 is typically about 500 to about 3000 Å thick. This insulating layer 8 is then planarized down to the conductive layer leaving portions of it remaining in the first indentations. The planarizing is typically carried out employing chemical-mechanical polishing technique. This produces an oxide cap self-aligned to the subsequently to be formed floating gate (see FIG. 5). Those portions of the first conductive layer 6 not located beneath the portions of the insulating layer 8 that remain are removed.

In other words, the remaining portions of the insulating layer 8 act as a mask for defining the floating gate conductor. The exposed polycrystalline silicon can be removed by reactive ion etching (see FIG. 6).

Next, the insulating layer 2 can be removed such as stripping in suitable etchants.

A device insulating layer 9 can be deposited or grown on the structure. This is typically formed by thermal oxidation and is typically about 30 to about 300 Å thick, more typically about 60 to about 100 Å thick. Any source or drain implants can be provided.

Figure 7:
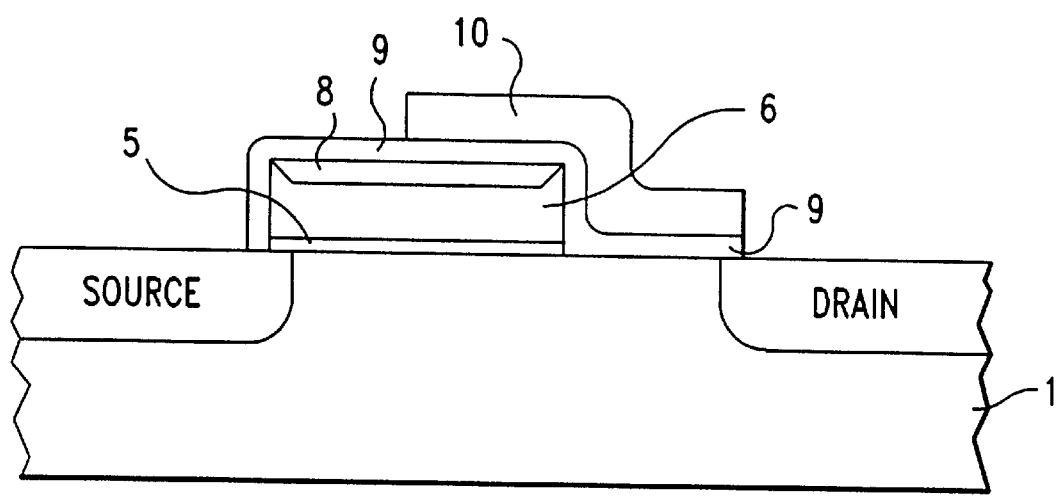

The second conductive layer or control gate 10 is then formed (see FIG. 7).

Figure 6:
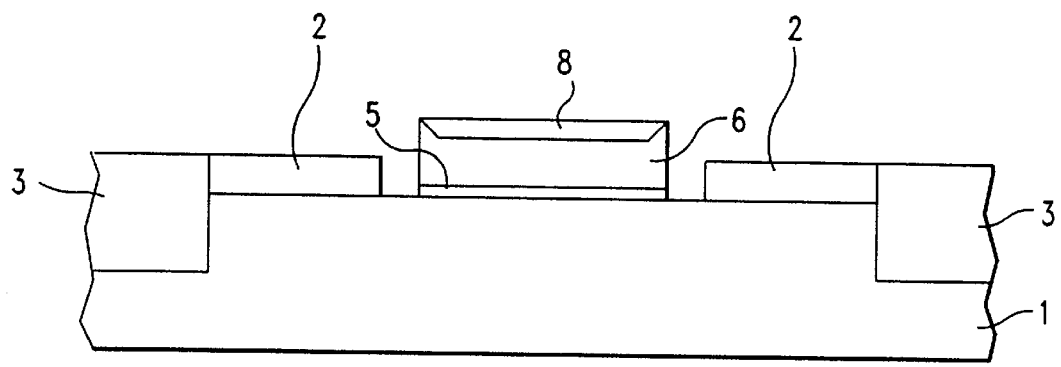

As can be appreciated, the geometry of the sharp points of the floating gate as shown in FIG. 6 can be tailored by altering the thickness of insulating layer 2, polycrystalline silicon film thickness and polysilicon deposition conformality.

Figure 8:
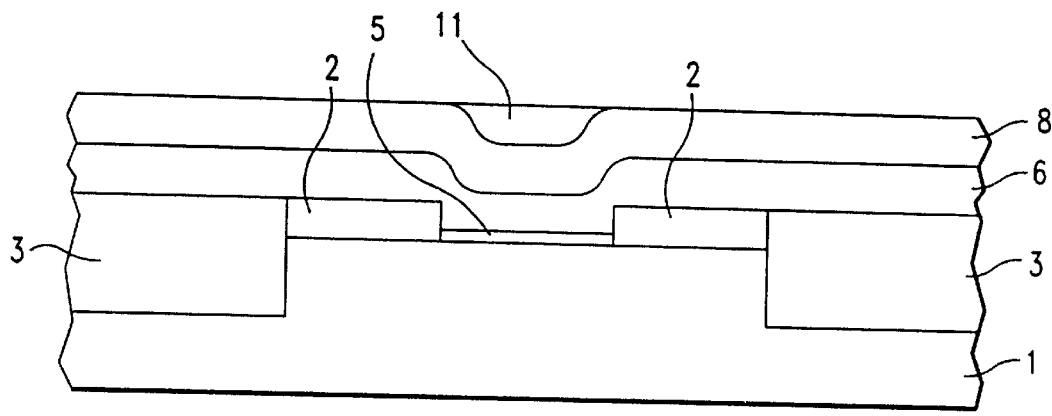
FIGS. 8–12 represent a schematic diagram of the structure in various stages of an alternative process according to the present invention.

According to an alternative fabrication process of the present invention, the insulating layer 8 that has indentations located over the indentations 7 of the conductive layer 6 is provided, followed by forming a patterning material 11 in the indentations of insulating layer 8 (see FIG. 8). The patterning material 11 is a photoresist material. Typical suitable photoresist materials include positive photoresists based upon phenolic-formaldehyde novolak polymers. A particular example of such is Shipley AZ-1350 which is a M-cresole formaldehyde novolak polymer composition. Such includes a diazo ketone such as 2-diazo-1-naphthol-5-sulfonic acid ester.

Figure 9:
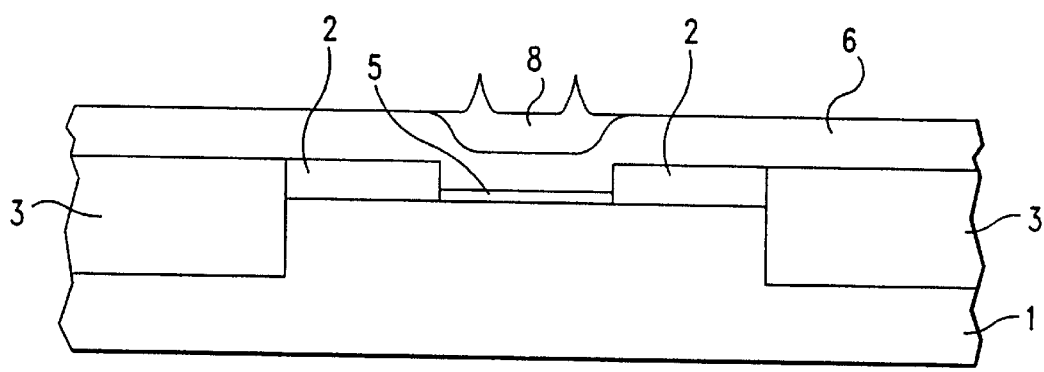
Figure 10:
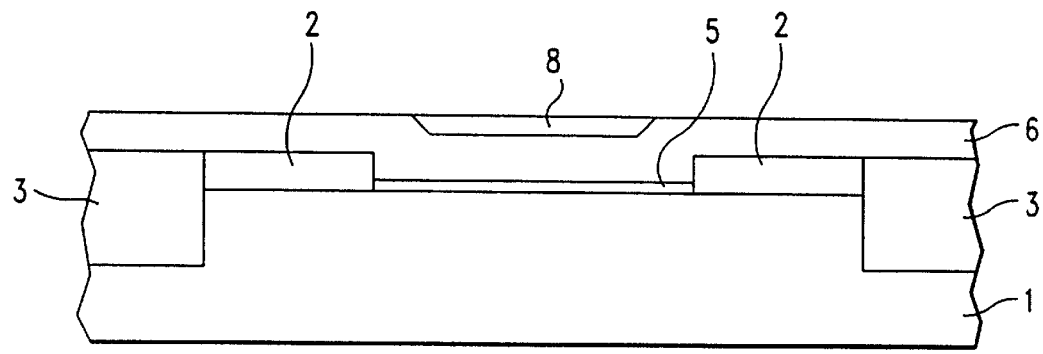

Portions of the insulating layer 8 not located beneath the resist material 11 are removed such as by reactive ion etching (see FIG. 9). The resist material acts as a mask for defining the insulating layer 8. Any remaining photoresist material can now be removed. The structure is then planarized, leaving portions of the insulating layer 8 remaining in the first indentations (see FIG. 9). The planarization is carried out employing chemical-mechanical polishing.

Portions of the conductive layer 6 not located beneath the remaining portions of the insulating layer 8 are removed, the insulating layer 8 acting as a mask. The conductive material 6 can be removed by reactive ion etching.

Figure 11:
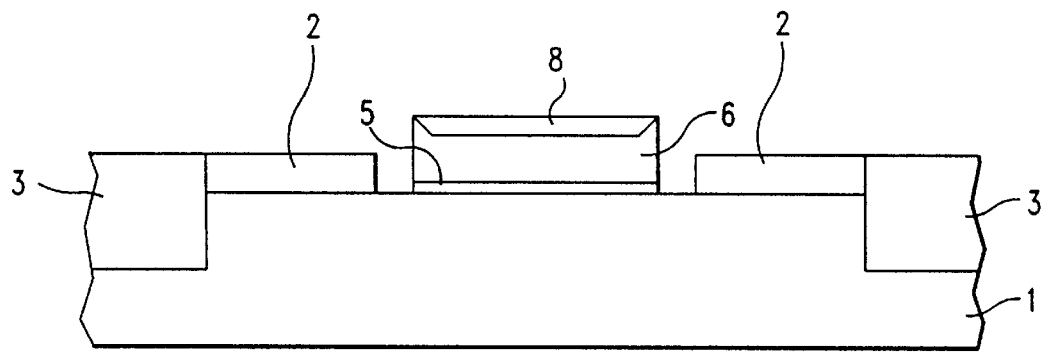
Figure 12:
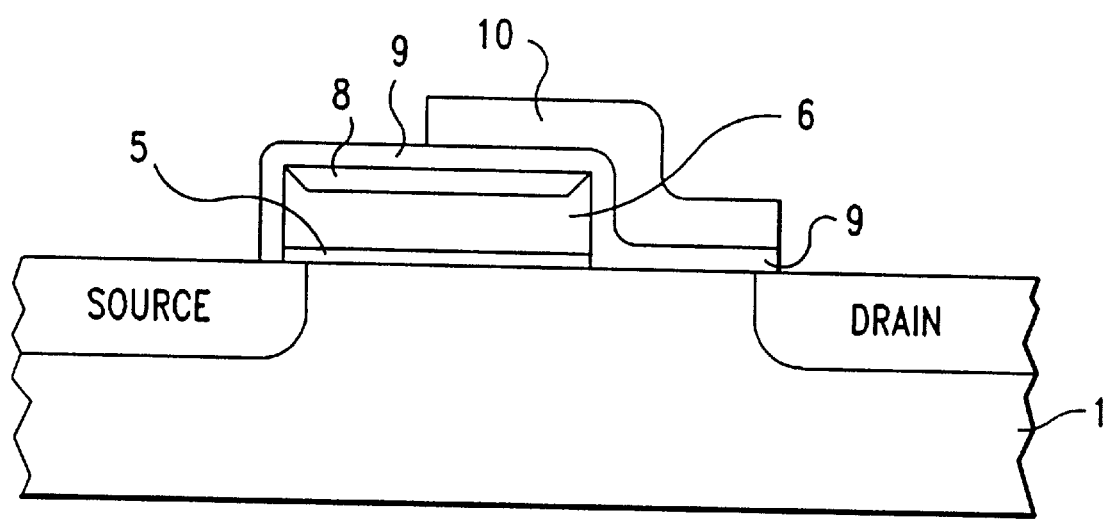

Device insulating layer 9 can then be formed such as by oxidation (see FIG. 11). This can be followed by fabricating the control gate 10 (see FIG. 12).

Source and drain implants can be provided where deemed necessary.

According to another embodiment of the present invention, a first insulating layer 2 is provided on a substrate 1. The insulating layer 2 can be grown on the substrate or can be provided by deposition techniques such as chemical vapor deposition (CVD) or physical vapor deposition (PVD). Insulating layer 2 is typically silicon nitride and conventionally referred to as the pad nitride. Typically, this layer 2 is about 200 to about 5000 Å thick and more typically about 1000 to about 2500 Å thick.

Predetermined portions of the first insulating layer 2 are removed as well as removing some of the substrate 1 located beneath the removed portions of this first insulating layer. The insulating layer portions can be removed by reactive ion etching.

A second insulating layer 3 is provided on the substrate and on at least some of the remaining portions of the first insulating layer. This second insulating layer 3 is typically an oxide which can be formed by CVD of tetraethylorthosilicate (TEOS). Typically this layer is about 1000 to about 10,000 Å thick and more typically about 3000 to about 5000 Å thick.

Figure 13:
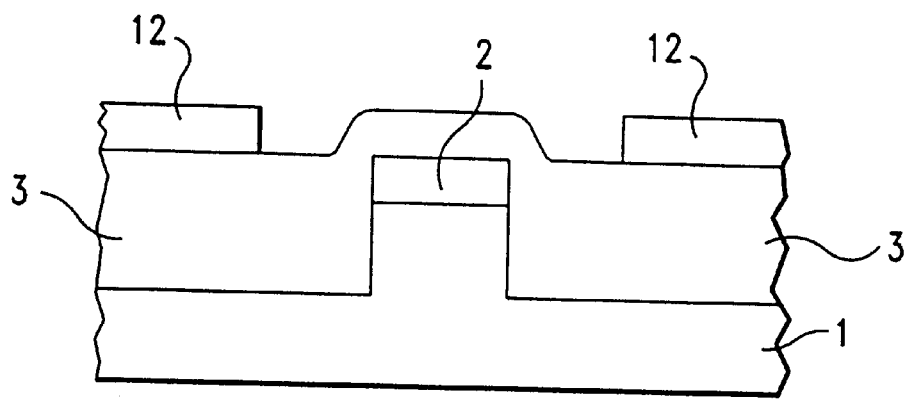
FIGS. 13–18 are schematic diagrams of the structure in various stages of the processing according to a further embodiment of the present invention.

A first patterning layer 12 such as a photoresist is formed on the second insulating layer 3. A pattern is delineated in the first patterning layer down to the second insulating layer 3. The pattern provides openings located above and wider than at least one of the remaining portions of the first insulating layer 2 (see FIG. 13).

A second patterning material 13 such as a photoresist is then deposited on the first patterning layer 12 and in the delineated opening.

Figure 14:
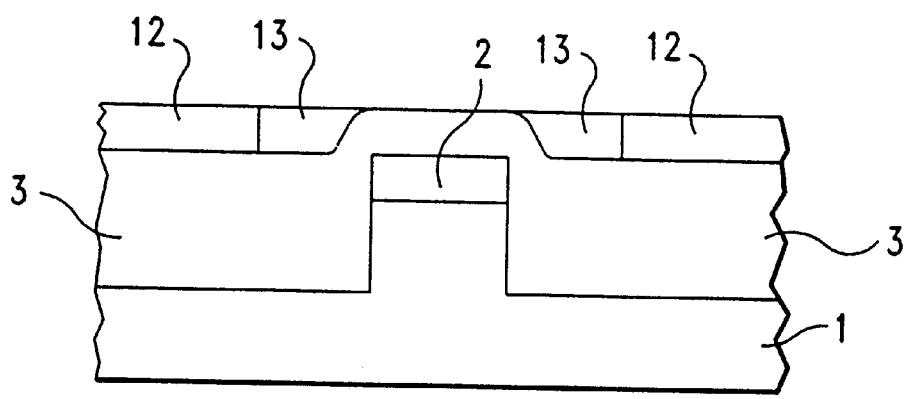
Figure 15:
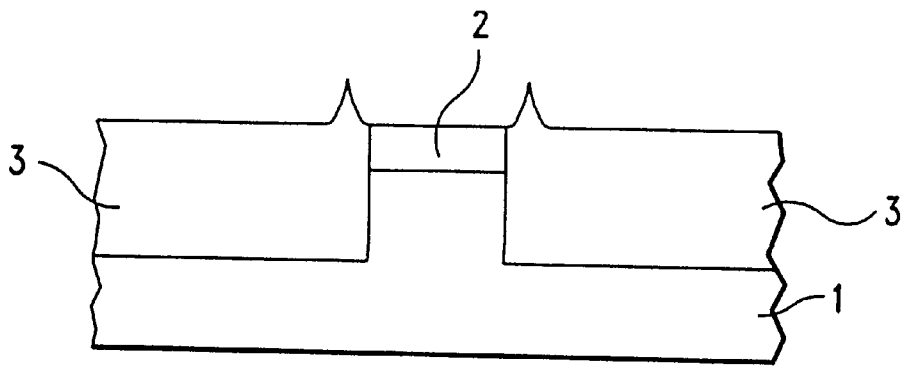
Figure 16:
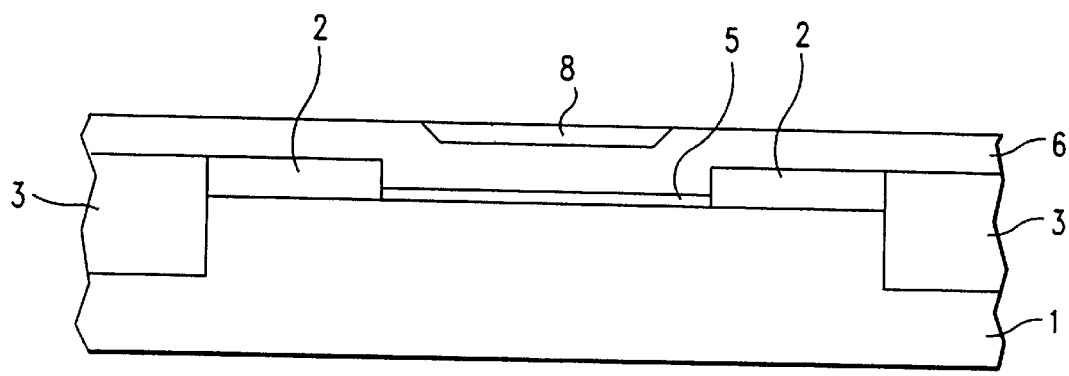
Figure 17:
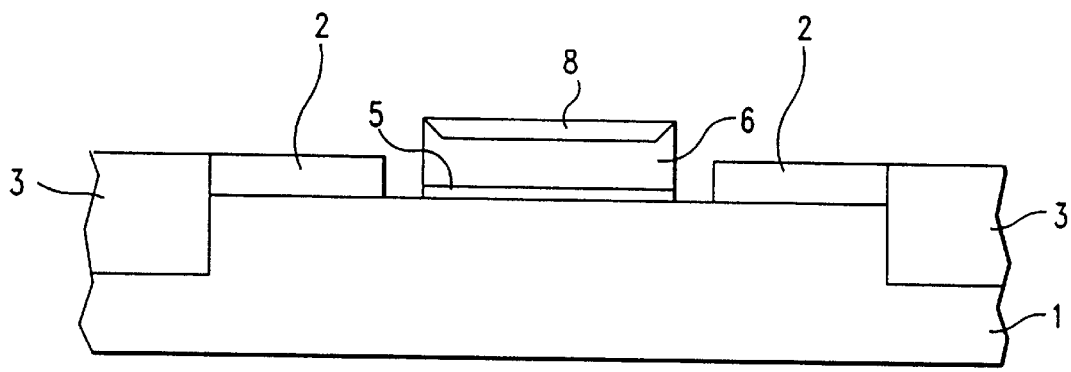
Figure 18:
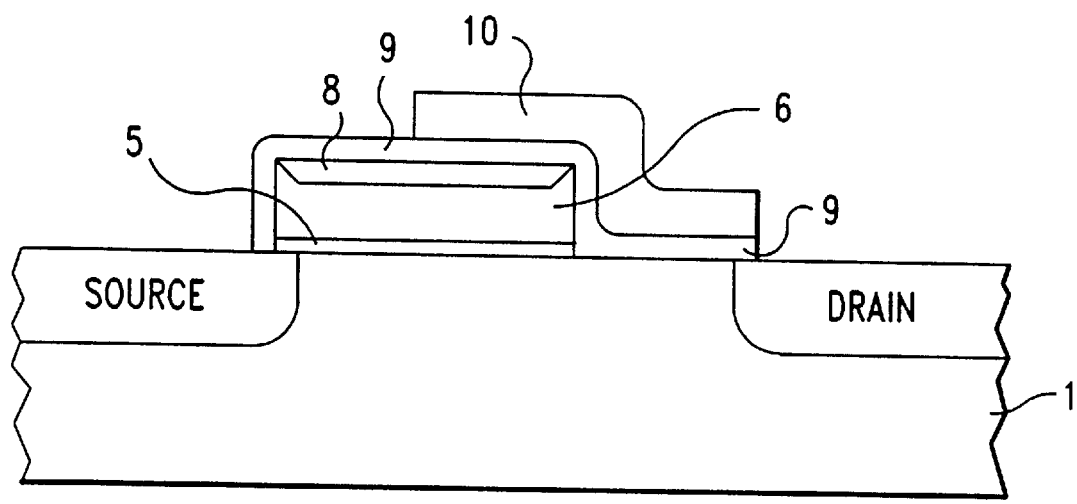

The structure is then planarized such as by reactive ion etching until a portion of the second insulating layer 3 is exposed (FIG. 14).

Next, the exposed portion of the second insulating layer 3 is removed such as by etching down to or near to at least one of the remaining portions of the first insulating layer. The removal can be carried out by reactive ion etching.

The structure is then again planarized down to at least the first insulating layer 2 resulting in forming adjacent regions of the first insulating layer and second insulating layer. The planarizing can be carried out by chemical mechanical polishing.

An opening is created in the first insulating layer 2 and overlapping an adjacent region on the second insulating layer 3. This opening can be formed by reactive ion etching and masking those portions which are not to be removed. The opening has a depth equal to or greater than a depth of the first insulating layer but less than that of the second insulating layer and results in exposing a substrate area located beneath the first insulating layer.

A thin insulating layer 5 is then formed on the substrate area. This can be achieved by thermal oxidation. The thin insulating layer 5 is typically about 30 to about 300 Å thick and more typically about 60 to about 100 Å thick.

A first conductive layer 6 such as polysilicon is deposited. The first conductive layer 6 has first indentations 7 located over the thin insulating layer 5. The first conductive layer 6 is typically about 300 to about 5000 Å thick and more typically about 600 to about 2000 Å thick.

A fourth insulating layer 8 is formed on the first conductive layer 6. The fourth insulating layer 8 is typically silicon dioxide and can be formed by oxidation or deposited by chemical vapor deposition. This layer 8 is typically about 50 to about 5000 Å thick and more typically about 500 to about 3000 Å thick.

The fourth insulating layer 8 is then planarized such as using chemical mechanical polishing down to the first conductive layer 6 including leaving portions of the fourth insulating layer 8 remaining in the first indentations 7.

The conductive layer not located beneath the portions remaining of the fourth insulating layer is removed such as by reactive ion etching. The remaining fourth insulating layer 8 acts as an etching mask.

The device insulating layer 9 is formed by oxidation over the first conductive layer. The device insulating layer is typically silicon dioxide. This layer is typically about 30 to about 300 Å thick and more typically about 60 to about 100 Å thick.

Next, source and drain implants can be provided where desired.

A second conductive layer 10 to act as the control gate is then formed and defined.

In a further alternative method according to the present invention, the structure is fabricated by following the above sequence shown in FIGS. 13 to 18 up through the step of forming the fourth insulating layer 8 on the first conductive layer 6. At this point, the fabricating follows the sequencing described with reference to FIGS. 8–12 and particularly the fourth insulating layer formed on the first conductive layer has second indentations located over the first indentations in the first conductive layer.

A patterning material 15 such as a photoresist is deposited in the second indentations. The patterning material 15 acts as a mask for removing portions of the fourth insulating layer 8 that are not located beneath the patterning material. After removal of the fourth insulating layer 8 not located beneath the patterning material such as by reactive ion etching. Any remaining photoresist material can now be removed. The structure is planarized leaving portions of the fourth insulating layer 8 located in the first indentations. The planarization can be carried out by chemical mechanical polishing.

Next, regions of the first conductive layer 6 not located beneath the remaining portions of the fourth insulating layer 8 are removed such as by reactive ion etching with the fourth insulating layer acting as a mask.

After this, a device insulating layer 9 is formed followed by depositing a second conductive layer such as polysilicon over at least a portion- of the first conductive layer. Source and drain implants can be provided when desired.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for providing a substantially biplanar substrate structure having a first insulating material on a first plane of the substrate adjacent to a second insulating material on a second plane of the substrate, wherein the first plane is above the second plane, which comprises the following steps:

a) forming an opening in the first insulating material and overlapping the second insulating material down to at least the first plane of the substrate, including exposing a first plane substrate area;

b) forming a thin insulating layer on said first plane substrate area;

c) forming a first conductive layer on the structure formed after step b) wherein said first conductive layer has first indentations over said opening;

d) forming a second insulating layer on said conductive layer;

e) planarizing said second insulating layer down to said conductive layer, including leaving portions of said second insulating layer in said first indentations;

f) removing regions of the first conductive layer not located beneath said portions of said second insulating layer; and g) forming a device insulating layer, and then forming a second conductive layer over at least a portion of said first conductive layer.

2. The process of claim 1 wherein step d) comprises forming a second insulating layer on said first conductive layer and wherein said second insulating layer has second indentations located over said first indentations; and which process further comprises after step d) and before step e) the steps of:

h) forming a patterning material in said second indentations; and i) removing portions of said second insulating layer not located beneath said patterning material, and j) removing patterning material.

3. A method of making a structure comprising the steps of:

a) providing a substrate;

b) forming a first insulating layer on said substrate;

c) removing predetermined portions of said first insulating layer, including removing some of the substrate beneath removed portions of said first insulating layer;

d) forming a second insulating layer on said substrate and on at least some of the remaining portions of said first insulating layer;

e) forming a first patterning layer on said second Insulating layer;

f) forming an opening above and wider than at least one of the remaining portions of said first insulating layer through said first patterning layer down to said second insulating layer;

g) disposing a second patterning material on said first patterning layer and in the opening;

h) planarizing a top surface of the structure as formed after step g) until a portion of said second insulating layer is exposed;

i) removing a portion of the-exposed portion of said second insulating layer;

j) removing any remaining portions of said first patterning layer and said second patterning material;

k) planarizing the structure formed after step j) down to at least said first insulating layer, including forming adjacent regions of said first insulating layer and said second insulating layer;

l) forming an opening in said first insulating layer and overlapping an adjacent region of said second insulating layer, the opening having a depth equal or greater than a depth of said first insulating layer but less than a depth of said second insulating layer, including exposing a substrate area beneath said first insulating layer;

m) forming a thin insulating layer on said substrate area;

n) forming a first conductive layer on the structure formed after step m) having first indentations over said opening;

o) forming a fourth insulating layer on said first conductive layer;

p) planarizing said fourth insulating layer down to said first conductive layer, including leaving portions of said fourth insulating layer in said first indentations;

q) removing regions of said conductive layer not located beneath the portions of said fourth insulating layer; and r) forming a device insulating layer and then forming a second conductive layer over at least a portion of the first conductive layer.

4. The process of claim 3 wherein step o) comprises forming a fourth insulating layer on said first conductive layer and wherein said fourth insulating layer has second indentations located over said first indentations; and which process further comprises after step o) and before step p) the steps of:

s) forming a patterning material in said second indentations;

t) removing portions of said fourth insulating layer not located beneath said patterning material; and u) removing patterning material.

5. The process of claim 1 wherein the first conductive layer and second conductive layer are polysilicon.

6. The process of claim 1 wherein said planarizing is carried out using CMP.

7. The process of claim 1 wherein said regions of the first conductive layer are removed by reactive ion etching.

8. The process of claim 1 wherein the thickness of the second insulating layer is about 500 Å to about 3000 Å.

9. The process of claim 2 wherein the first conductive layer and second conductive layer are polysilicon.

10. The process of claim 2 wherein said planarizing is carried out using CMP.

11. The process of claim 2 wherein said regions of the first conductive layer are removed by reactive ion etching.

12. The process of claim 2 wherein the thickness of the second insulating layer is about 500 Å to about 3000 Å.

13. The process of claim 3 wherein the first conductive layer and second conductive layer are polysilicon.

14. The process of claim 3 wherein said planarizing is carried out using CMP.

15. The process of claim 3 wherein said regions of the first conductive layer are removed by reactive ion etching.

16. The process of claim 3 wherein the thickness of the second insulating layer is about 500 Å to about 3000 Å.

* * * * *